(12) United States Patent
Mozetic et al.

(10) Patent No.: US 6,256,361 B1
(45) Date of Patent: Jul. 3, 2001

(54) D.T.R.M. DATA TIMING RECOVERY MODULE

(75) Inventors: Carlo Mozetic, Rome; Francesco Testa, Pomezia, both of (IT)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 09/171,844

(22) PCT Filed: Apr. 18, 1997

(86) PCT No.: PCT/SE97/00665

§ 371 Date: Jul. 23, 1999

§ 102(e) Date: Jul. 23, 1999

(87) PCT Pub. No.: WO97/41665

PCT Pub. Date: Nov. 6, 1997

(30) Foreign Application Priority Data

Apr. 29, 1996 (SE) .................................... 9601640

(51) Int. Cl.⁷ ...................................................... H04L 7/02
(52) U.S. Cl. ......................... 375/360; 375/376; 327/159; 331/25
(58) Field of Search ..................................... 375/354, 359, 375/360, 373, 376; 327/141, 155, 159; 331/25

(56) References Cited

U.S. PATENT DOCUMENTS

| | | | |
|---|---|---|---|
| 4,918,406 * | 4/1990 | Baumbach et al. | 331/117 |
| 5,050,167 | 9/1991 | Izadpanah . | |
| 5,276,712 | 1/1994 | Pearson . | |
| 5,574,756 * | 11/1996 | Jeong | 375/376 |
| 5,761,255 * | 6/1998 | Shi | 375/360 |
| 5,812,619 * | 9/1998 | Runaldue | 375/376 |
| 5,987,085 * | 11/1999 | Anderson | 375/374 |
| 6,133,802 * | 10/2000 | Ma | 331/172 |

FOREIGN PATENT DOCUMENTS 63-174442 7/1988 (JP) .
7-143200 6/1995 (JP) .

* cited by examiner

*Primary Examiner*—Amanda T. Le
(74) *Attorney, Agent, or Firm*—Burns, Doane, Swecker & Mathis, L.L.P.

(57) ABSTRACT

A data timing recovery system for clock recovery based on a pulse generator circuit and an injection locked oscillator ILO, which extracts the clock signal at high rate and preserves the timing information during long "0" or "1" sequences. This system may also include a clock extractor circuit including the ILO, a phase aligner circuit and a clock killer circuit. Connections to and from the system are an incoming data link, an outgoing data link, an outgoing clock link, an enable/disable link and a loss of signal data link. A data link connected between the pulse generator circuit and the phase aligner circuit and to the clock killer circuit. A pulse link connected to the ILO. A recovered clock link connected between the clock extractor circuit and the phase aligner circuit.

16 Claims, 7 Drawing Sheets

D.T.R.M. DATA TIMING RECOVERY MODULE

TECHNICAL FIELD OF THE INVENTION

The present invention relates to a data timing recovery module for clock recovery, more particular to clock extraction.

DESCRIPTION OF RELATED ART

Clock recovery is a well known method to recover timing on a signalling link. The simplest way to send data on a serial electrical link is to use two different physical connections, one for data and one for timing, clock. One of the connections can be avoided by extracting the timing information from the data by means of a special code, for example CMI, HDB3, AMI etc. By using one of these transmission codes, the normal data bandwidth will be differently distributed and some high frequency components will be generated. These components are used to extract the timing information. This procedure is called "clock recovery."

By using one of the previous codes the data bandwidth will be enlarged. Because of that, it will be necessary to increase the transmission media performance, and consequently more expensive. This problem has been solved by using codes that preserve the bandwidth characteristics, but the timing recovery operation is more difficult. Circuits normally used for the clock extraction need one or more data transitions every few bit group, or the clock could not be extracted. The code used must guarantee this condition, e.g. non-return to zero (NRZ) scrambled data. The clock extraction problem is easily solved, especially if the data pattern used is poor of transitions.

There are two existing methods to realize the clock extraction from an NRZ scrambled data link: The first method consists of a narrow band phase locked loop (PLL), circuit with a digital phase comparator that continuously measures the phase difference between the positive (or negative) data transition and the clock edges which are generated by a local oscillator. The frequency of this oscillator will be adjusted so as to eliminate the phase difference between data transitions and clock edges. This is an expensive solution because often it is difficult to implement by standard discrete components. Furthermore, the flexibility is limited using this method because all the physical parameters such as frequency, pattern, etc. cannot be changed to cover other possible requirements.

The second method to extract the timing information consists of the application of a Q tank followed by a high gain selective amplifier stage. The Q tank is realized by a simple LC circuit, or by using a SAW resonator, continuously stimulated from data edges transitions. If a LC resonator is used, a special inductor is needed in order to have a sufficiently large Q value to preserve the timing information during long "0" or "1" sequences. This is a more flexible solution, but it has lower performance than the one described previously. The recovered clock, for example, is affected by jitter because the S/N ratio is very low at the Q tank output, especially if the pattern used is poor of transitions.

JP 88-174442 by Masushita et al, have an oscillator in free running mode to guarantee a timing clock at the output XXX. The invention is to suppress the appearance of noise and jitter in periodical reproduction output, by obtaining a required iming clock based on self-advancing oscillation.

SUMMARY

One problem this invention solves is to extract a clock signal at high rate.

Another problem this invention solves is to preserve the timing information during long "0" or "1" sequences.

This invention solves the clock recovery problem in a new way by using a known effect which was originally used for another purpose. The purpose was for frequency modulation receivers, carrier modulation systems and to multiply or divide a clock frequency by an integer number.

The present invention is a data timing recovery system, i.e. a data timing recovery module (DTRM), which is based on an injection locked oscillator, ILO. This invention extracts the timing information from a high bit rate data signal, e.g. scrambled NRZ coming from optical or electrical interfaces. Other data patterns than NRZ can be used. The timing recovery system uses a lock-in phenomena in the ILO. The timing information will be extracted even if the data stream is composed by long sequences of bit logic level "1" or by long sequences of bit logic level "0" repeatedly. At every data transition event, a zero crossing circuit generates a pulse which is used to phase lock the frequency generated by the oscillator.

This invention has at least two parts; the pulse generator circuit, and the injection locked oscillator. Other parts that can be used are a clock extractor circuit including the ILO, a phase aligner circuit and a clock killer circuit.

One advantage is that the DTRM can extract time information from high Mbit/s signals at a low cost.

Another advantage is that the DTRM can extract time information from high Mbit/s signals at high performance.

Another advantage is that the DTRM can be made to be very small in its dimensions.

Yet another advantage is that the DTRM is easy adaptable to different bit rate operation.

The invention is now being described further with the help of the detailed description of preferred embodiments and attached drawings.

DETAILED DESCRIPTION OF EMBODIMENTS

A more detailed description of the present invention will hereby be presented.

The present invention relates to a clock recovery circuit for telecommunication equipment. This circuit can be used in other applications as well, where clock recovery is needed for high speed transmission links.

Figure 1:
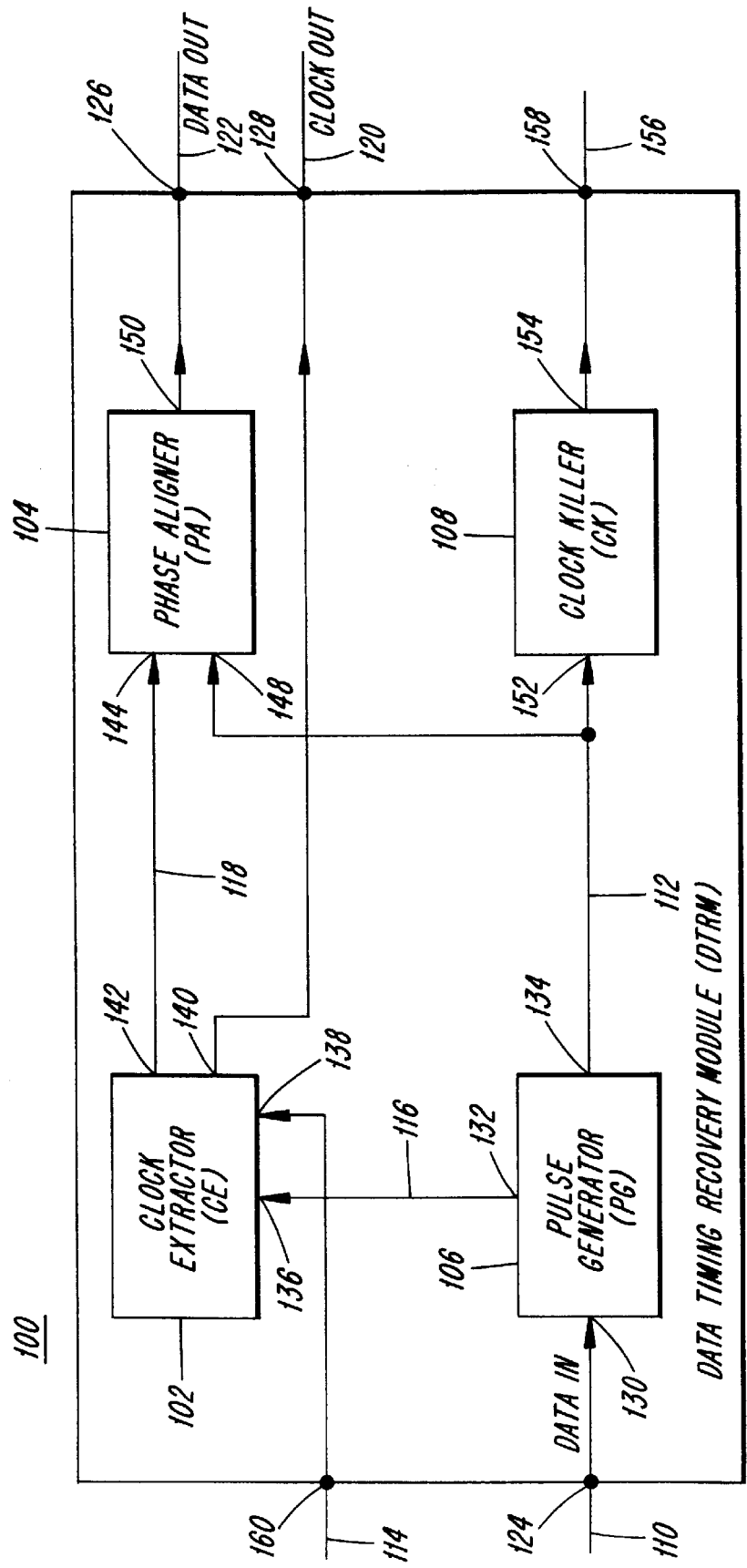
FIG. 1 shows a block diagram of a data timing recovery module, DTRM.

A short description of the drawings will be presented. FIG. 1 shows a block diagram of a data timing recovery module 100, DTRM. The four blocks include; a clock extractor circuit 102, CE, i.e. a pulse controlled oscillator circuit (PCO), a phase aligner circuit 104, PA, a pulse generator circuit 106, PG, and a clock killer circuit 108, CK. These blocks are connected to each other by physical links. The data timing recovery module 100 has two incoming data links; the first incoming link being an incoming data link 110, carrying incoming data, connected to an incoming data link input 124, and the second incoming link being an enable/disable link 114, carrying an external clock disable signal, connected to an incoming clock disable input 160. The DTRM 100 also has three outgoing links; the first outgoing link being an outgoing data link 122, carrying phase aligned data, connected to an outgoing data link output 126, the second outgoing link being an outgoing clock link 120, carrying first recovered clock, connected to an outgoing clock link output 128, and the third outgoing link being a loss of signal link 156, carrying a data loss signal, connected to a loss of signal output 158.

The pulse generator 106 has an incoming link being the incoming data link 110, connected to an incoming data link input 130 via the incoming data link input 124 of the DTRM 100. The pulse generator 106 also has two output links; the first output link being a pulse link 116, carrying pulses, connected between a pulse link output 132 and to a pulse link input 136 of the clock extractor 102, the second output link being a data link 112, carrying data, connected to a data link output 134 and to a data link input 152 of the clock killer 108. The data link 112 is also connected to a data link input 148 of the phase aligner 104.

The clock extractor 102 has two incoming links; the first incoming link being the enable/disable link 114 connected to an enable/disable link input 138 via the incoming clock disable input 160 of the DTRM 100, and the second link being the pulse link 116 connected to the pulse link input 136. The clock extractor 102 also has two outgoing links; the first outgoing link being a recovered clock link 118, carrying second recovered clock, which can be inverted to the first recovered clock on the outgoing clock link 120, connected to a clock link output 142 and a clock link input 144 of the phase aligner 104, and the second outgoing link being the outgoing clock link 120 connected to an outgoing clock link output 140 via the outgoing clock link output 128 of the DTRM 100.

The phase aligner 104 has two incoming links; the first incoming link being the recovered clock link 118 connected to the clock link input 144, and the second incoming link being the data link 112 connected to the data link input 148. The phase aligner 104 has an outgoing link being the outgoing data link 122 connected to a phase aligner output 150 via the outgoing data link output 126 of the DTRM 100.

The clock killer 108 has an incoming link being the data link 112. This circuit also has an outgoing link being the loss of signal link 156 connected to a loss of signal output 154 via the loss of signal output 158 of the DTRM 100.

A more detailed description about each block in the data timing recovery module 100, DTRM, will be described in the next coming paragraphs. Only components that play a significant role in each circuit are shown. This embodiment works with a differential data input and output links. The incoming data link 110, the data link 112 and the outgoing data link 122 are in reality two links which have one ordinary and one differential link. The invention does not require this, but it is used in this solution.

Figure 2:
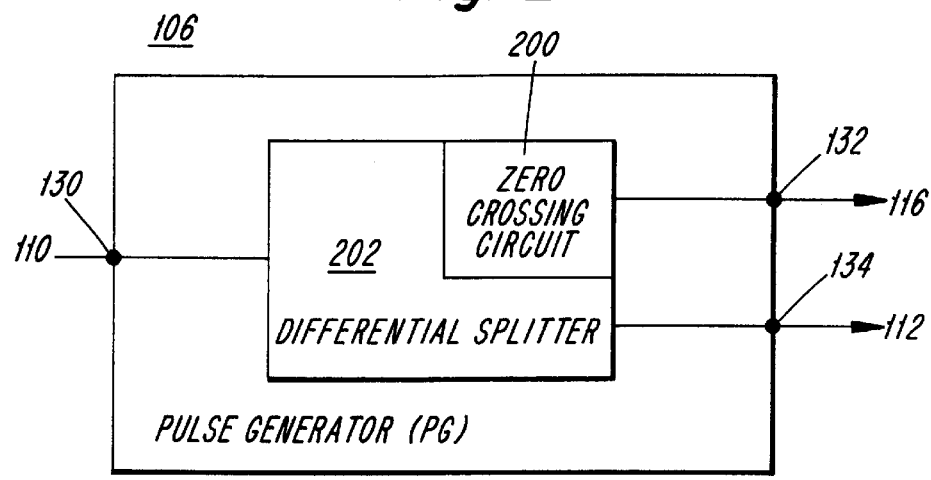
FIG. 2 shows a pulse generator circuit (PG).

In FIG. 2, the pulse generator circuit 106 receives incoming data on the incoming data link 110 connected to the incoming data link input 130 via the incoming data link input 124 of the DTRM 100. The pulse generator 106 sends out the pulses on the pulse link 116 connected between the pulse link output 132 and the pulse link input 136 of the clock extractor 102. In the pulse generator 106 contains two parts a zero crossing circuit 200 and a differential splitter 202. The differential splitter 202 is receiving the incoming data, on the incoming data link 110 to the zero crossing circuit 200. It sends out the pulses on the pulse link 116. The differential splitter 202 also sends out the data, which is equal to the incoming data, on the data link 112 connected between the data link output 134 and the data link input 152 of the clock killer 108. The data link 112 is also connected to the data link input 148 of the phase aligner 104.

Figure 3:
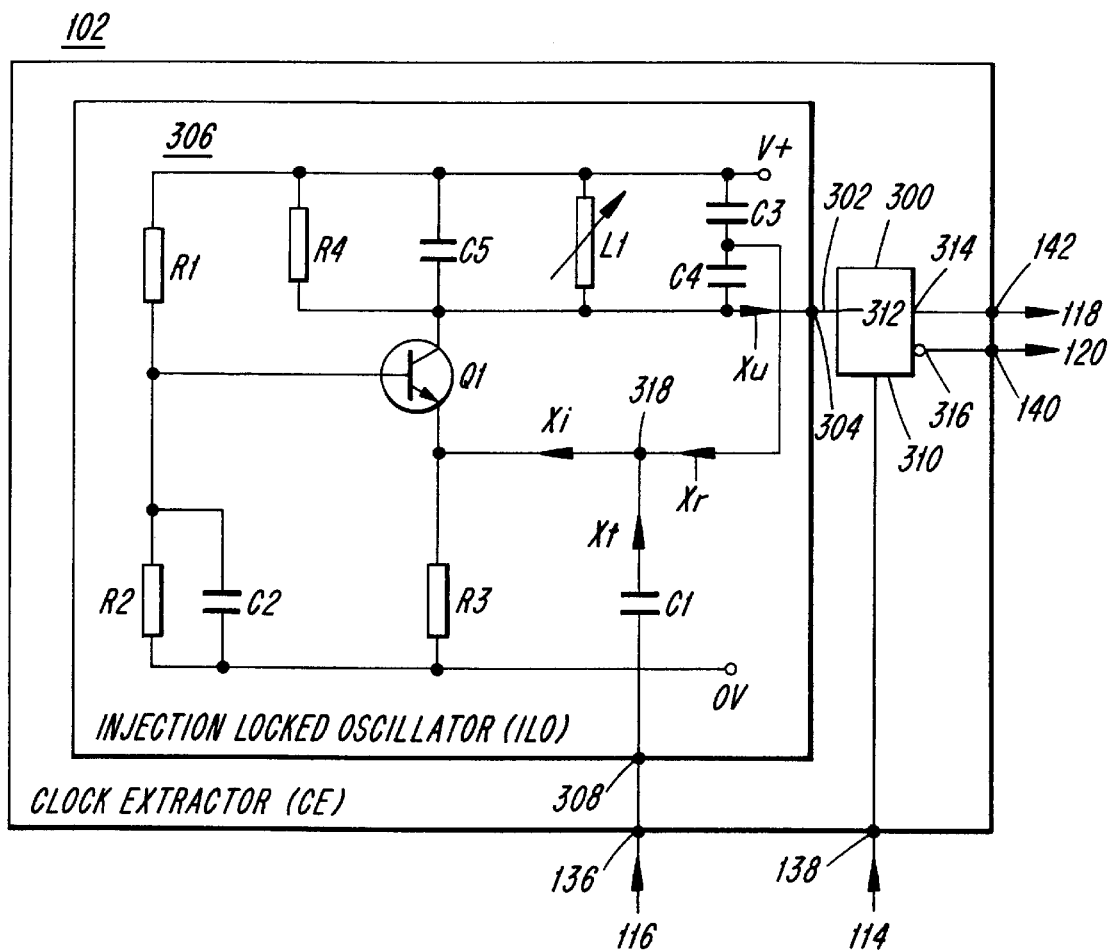
FIG. 3 shows a clock extractor circuit (CE).

In FIG. 3, the clock extractor circuit 102 receives pulses on the pulse link 116 connected between a pulse link input 136 and the pulse link output 132 of the pulse generator 106. The clock extractor 102 also contains an injection locked oscillator (ILO) 306 which has an oscillator input 308 and an oscillator output 304. The pulse link 116 is connected to the oscillator input 308 via the pulse link input 136. A clock extractor buffer 300 has two input links; first, a recovered clock link 302 connected to a first buffer input being a buffer input 312 and the oscillator output 304 of the ILO 306, and second, the enable/disable link 114 connected to the clock extractor buffer 300 via a second buffer input being a buffer input 310 and the enable/disable input 138. Optionally, the enable/disable link 114 can be connected externally to the loss of data signal link 156 to disable the clock in the case of no data on the incoming data link 110, see FIG. 1. The clock extractor buffer 300 has two outgoing links; first the outgoing link being the recovered clock link 118 connected to a first outgoing buffer output 314 via the clock link output 142, and second the outgoing buffer output being the outgoing clock link 120 connected to a second outgoing buffer output 316 via the outgoing clock link output 140.

The ILO 306 is an oscillator of a grounded base Colpitts architecture, Q1, e.g. a BFR92 transistor. The transistor Q1 bias point is fixed by using three resistors R1, R2 and R3. The resistors R1 and R2 determine the base voltage polarization and the resistor R3 determines the resistor collector current. A decoupling capacitor C2 is directly connected between the transistor Q1 base and the ground to obtain the dynamic grounded base architecture. The passive network, connected between the collector of the transistor Q1 and the positive power supply, determines all of the dynamic characteristics of this type of architecture which is called a "Grounded Base Colpitts Oscillator". In particular, capacitors C3, C4, C5 and inductance L1 determine the natural frequency of the oscillator 306, and resistor R4 is used to fix the transistor dynamic gain and also to increase the ILO 306 lock bandwidth. Reaction vector Xr is determined by the values of the two capacitors C3 and C4. Injection vector Xt is directly connected to the transistor emitter pin by using decoupling capacitor C1. The ILO 306 dynamic stability parameters depend also on the transistor type and on the electrical coupling of the ILO input and output. These are optimized in order to avoid frequency drift in the whole temperature operating range.

Figure 4:
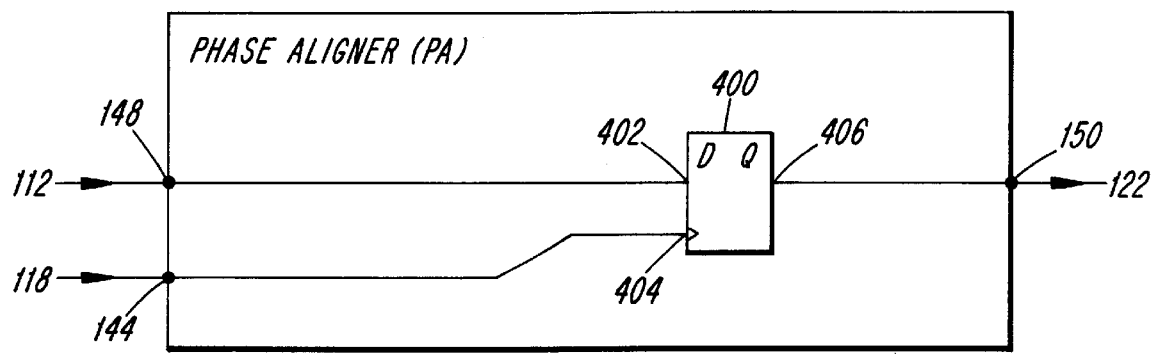
FIG. 4 shows a phase aligner circuit (PA).

FIG. 4 shows the phase aligner circuit 104 which gets data from the pulse generator 106 on the data link 112 which is connected between the data link input 148 of the phase aligner 104 and the data link output 134 of the pulse generator 106. The phase aligner 104 also receives the second recovered clock from the clock extractor 102, which is connected between the clock link output 142 of the clock extractor 102 and the clock link input 144 of the phase aligner 104. The phase aligner 104 emits phase aligned data from the phase aligner output 150 on to the outgoing data link 122 connected to the outgoing data link output 126 of the DTRM 100.

A D-flip-flop circuit 400 has two inputs; a first input 402 connected to the data link 112 via the data link input 148 of the phase aligner 106, and a second input 404 connected to the recovered clock link 118 via the clock link input 144 of the phase aligner 106. The flip-flop 400 has an output 406 connected to the outgoing data link 122 via the phase aligner output 150 of the phase aligner 106.

Figure 5:
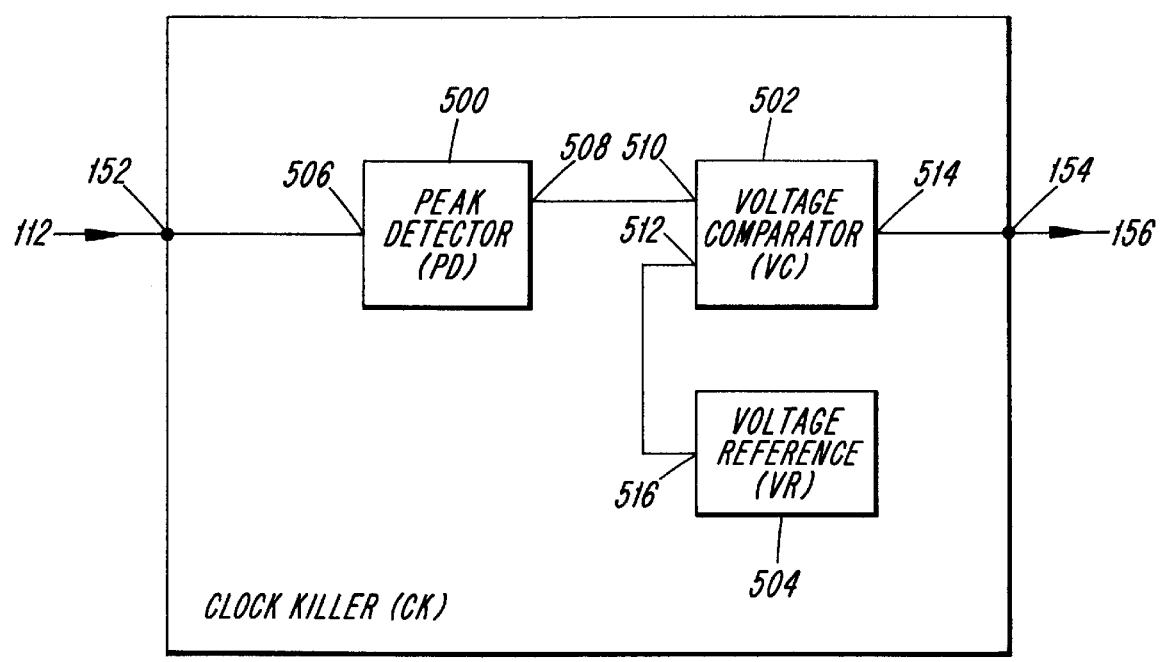
FIG. 5 shows a clock killer circuit (CK).

FIG. 5, the clock killer circuit 108 receives data from the data link 112 connected between the data link input 152 of the clock killer 108 and to the data link output 134 of the pulse generator 106. The clock killer 108 sends out the data loss signal on the loss of data link 156 which is connected to the loss of signal output 154 of the clock killer 108 and the loss of signal output 158 of the DTRM 100. The clock killer 108 has three blocks; a peak detector (PD) 500, a voltage comparator (VC) 502 and a voltage reference (VR) 504. These blocks (500–504) are connected to each other by physical links. The data which comes in from the data link 112 which is connected to the peak detector 500. It is in its turn connected to the voltage comparator 502. The VC 502 in its turn is connected to the loss of data link 156 via loss of signal output 154. The voltage reference 504 is connected to the voltage comparator 502.

Figure 6A:
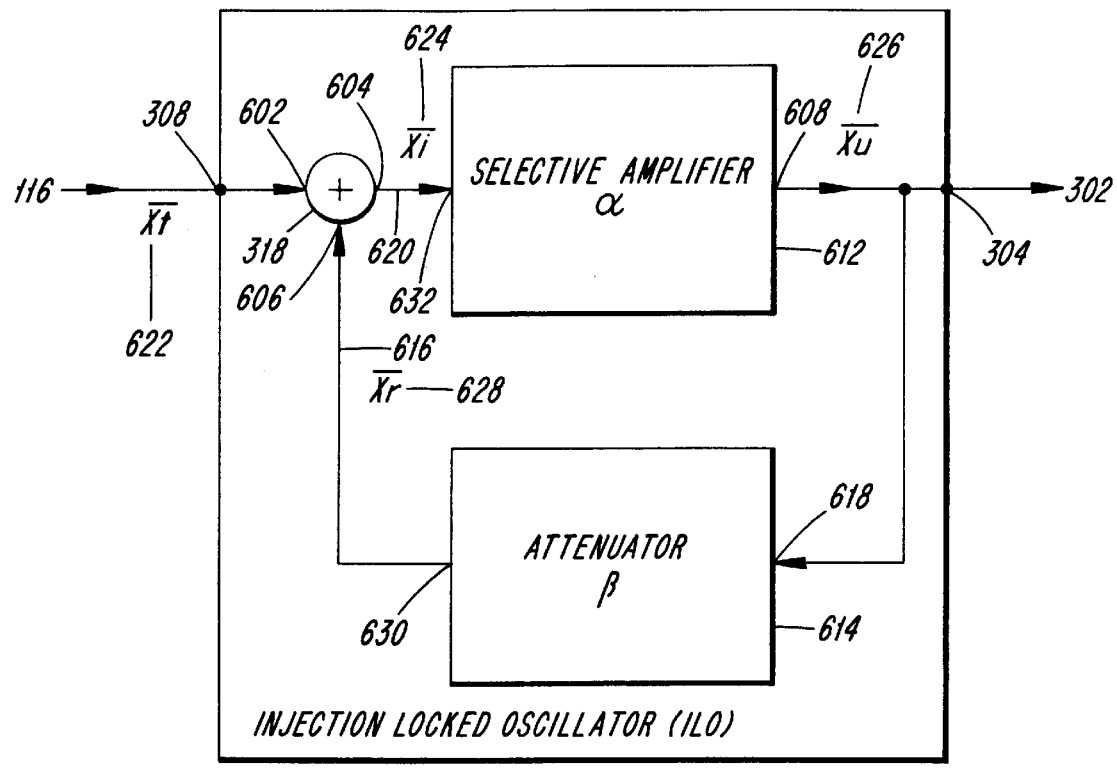
FIG. 6a shows the block diagram of an ILO.

FIG. 6a shows a block diagram of the injection locked oscillator 306. The ILO 306 has an incoming link being the pulse link 116 carrying the pulses, an injection $\overline{Xt}$ signal 622, connected between the oscillator input 308 of the ILO 306 and an adder node input 602 an adder node 318. The ILO 306 has an outgoing link being a recovered clock link 302 carrying a third recovered clock, a output vector $\overline{Xu}$ signal 626, connected between the oscillator output 304 of the ILO 306 and a selective amplifier output 608 at a selective amplifier 612. An adder node link 620 carrying a resultant $\overline{Xi}$ signal 624 connected between an adder node output 604 of the adder node 318 and a selective amplifier input 632 of the selective amplifier 612. Further, the recovered clock link 302 is connected to an attenuator input 618 at an attenuator 614. Therefore, the signal on the recovered clock link 302, the recovered clock link 118 and the outgoing clock link 120 is the same signal, see FIG. 1 and FIG. 3. An attenuation link 616 carrying a reaction $\overline{Xr}$ signal 628 is connected between an attenuator output 630 of the attenuator 614 and an adder node input 606 of the adder node 318.

Figure 6B:
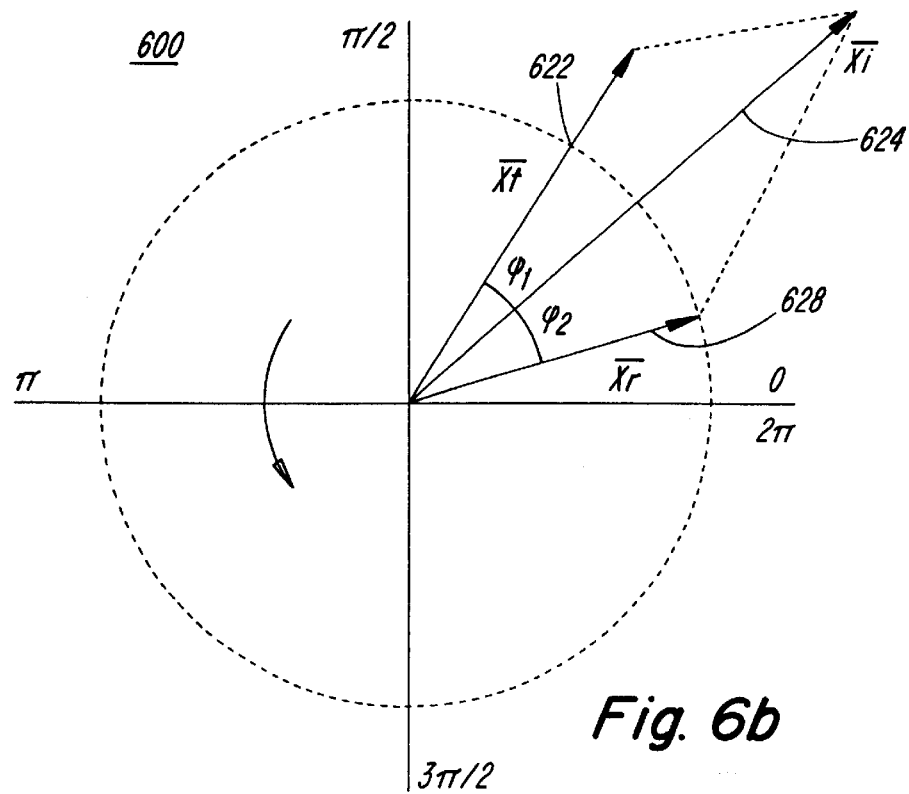
FIG. 6b shows the working principle of the ILO.

FIG. 6b shows a vectorial diagram 600 of the signals, the injection $\overline{Xt}$ signal 622, the reaction $\overline{Xr}$ signal 628 and the resultant $\overline{Xi}$ signal 624, and their relations to each other.

Figure 7:
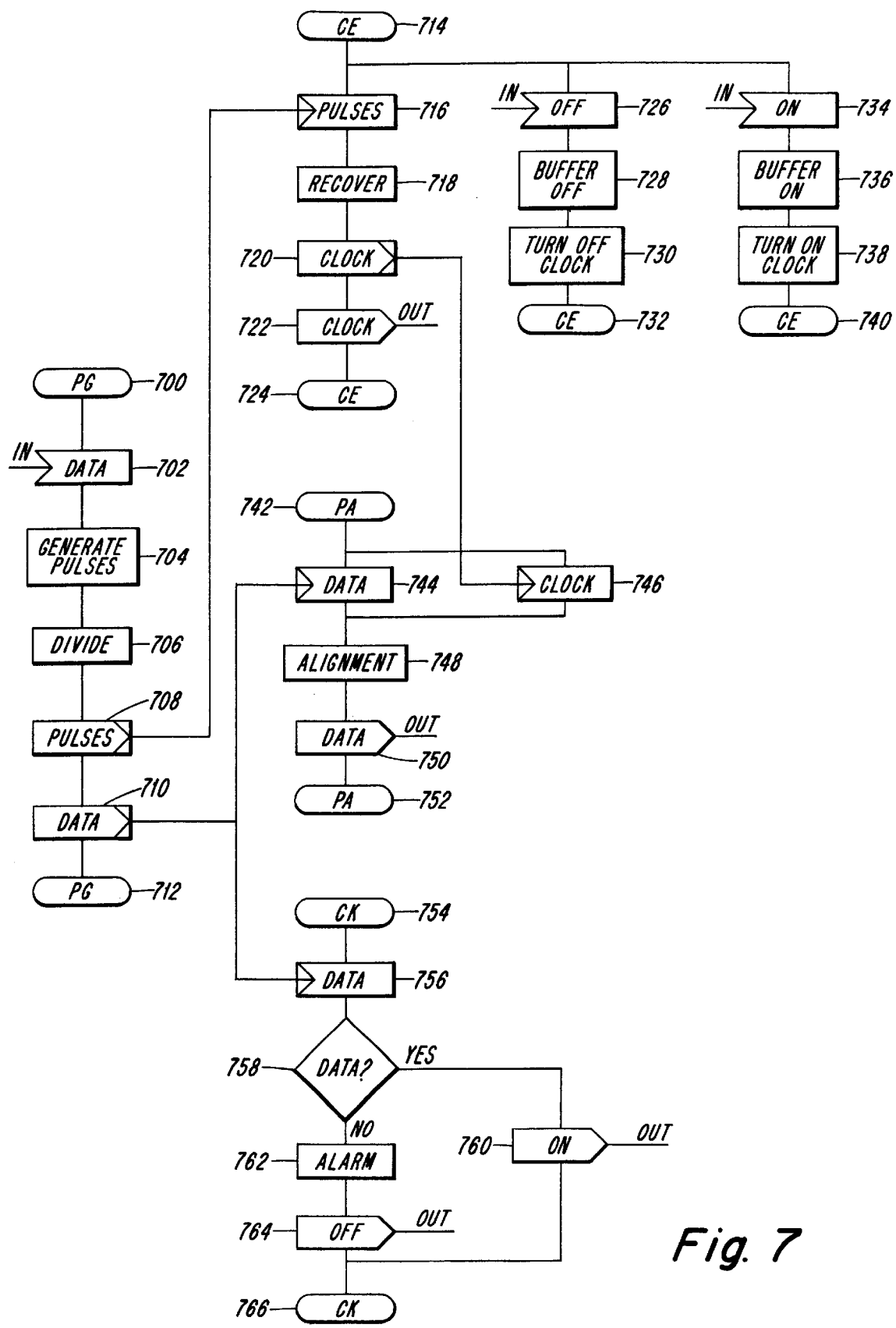
FIG. 7 shows a time relating flow chart for an incoming data signal which goes into the DTRM, which produces phase aligned data and recovered clock signals.

FIG. 7 shows a time related diagram over the method for extracting and aligning a clock signal and data from a combined clock and data signal, the incoming data 802.

The method for clock recovery starts with a pulse generator stage 700. Then the incoming "DATA" 702 is received. Then, the pulse generator circuit 106 generates 704 the pulses. Further, the pulse generator 106 divides 706 the incoming data.

Thereafter, the "pulses" 708 is distributed to a clock extractor stage 714 followed by distributing the "data" 710 to a phase aligner stage 742 and to a clock killer stage 754. As a last step the pulse generator stage 712 returns to 700, which is equal to the block 712.

The clock extractor stage 714 has three different sequences. The first sequence being a clock recovery sequence, which begins with receiving "pulses" 716 from the pulse generator stage 700. Then the clock extraction stage 700 recovers 718 the timing information in the ILO 306 with the help of the pulses. Thereafter, the second recovered "clock" 720 is distributed to "clock" 746 of the phase aligner stage 742 and the first recovered "CLOCK" 722 is also distributed to the outgoing clock link 120. As a last step the clock extractor stage 724 returns to the block 714 is equal to the 724. The second sequence being a switching off clock sequence, which begins with the clock extractor stage 714 can also receive the external clock disable signal "OFF" 726 on the enable/disable link 114. Then the clock extractor 102 turns off 728 clock extractor buffer 300 and turns off sending 730 the first and second recovered clock. As a last step clock extractor stage 732 returns to the block 714 which is equal to the block 732. The third clock sequence being a switching on clock sequence, which begins with switching on the clock extractor stage also receives the external clock disable signal "ON" 734 on the enable/disable link 114. Then the clock extractor 102 turns on 736 the clock extractor buffer 300 and turns on sending 738 the first and second recovered clock. As a last step clock extractor stage 738 returns to the block 714 which is equal to the block 738.

The phase aligner stage 742 receives "data" 744 from the pulse generator stage 700 and also receives second recovered "clock" 746 from the "clock" 720 of the clock extractor stage 714. Then these two signals are aligned, "alignment" 748. Thereafter, phase aligned "DATA" 750 is sent out on the outgoing data link 122. As a last step phase aligner stage 752 returns to the block 742 which is equal to the block 752.

The clock killer stage 754 receives "data" 756 from the pulse generator stage 700. Then, a question if there is any "data?" 758. If the answer is YES in 758, the data loss signal ON is sent 760 on the loss of signal link 156. If the answer is NO on the block 758 then an "alarm" 762 is notified. Further, the data loss signal OFF is sent 764 on the loss of signal link 156. As a last step from the blocks 760 and 764 this stage returns to clock killer stage 766 which is equal to 754.

Figure 8:
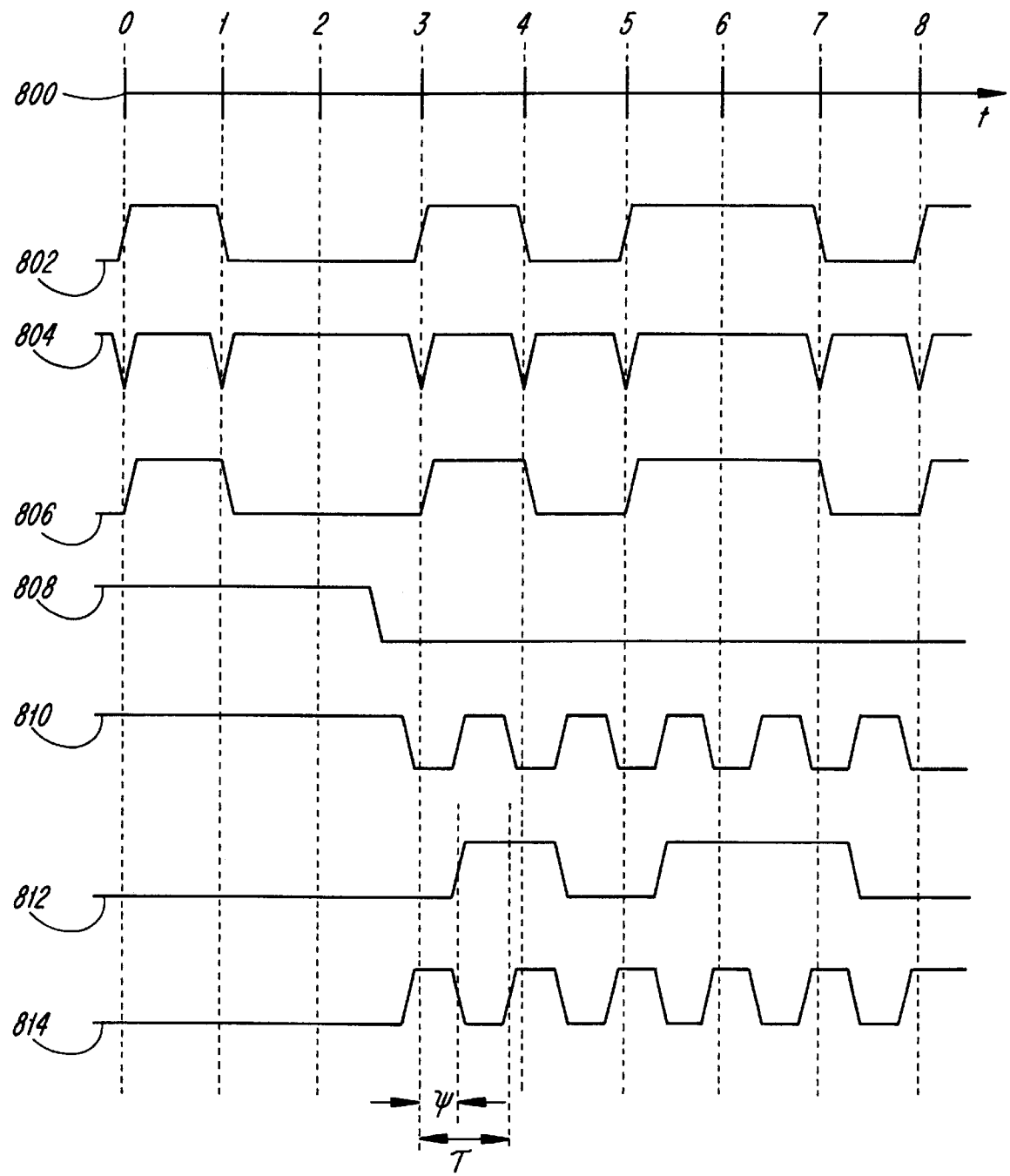
FIG. 8 shows a signal diagram over different signals in the DTRM.

FIG. 8 shows a signal diagram over different signals at different points in the DTRM 100. This is an example of how signals might appear in the DTRM 100. First a time ruler 800 shows signals at different time intervals. Incoming data 802 on the incoming data link 110 could have the following data pattern. A time interval is defined as the midpoint of positive derivative edge to negative derivative edges on a logic level "1", or the other way around for a logic level "0". Negative pulses 804 coming from the pulse generator 106 on the pulse link 116 are generated at each time interval at every data transition logic level "1" by the zero crossing circuit 200. Data 806 is carried on the data link 112. Initially, an external clock disable signal 808 is ON, e.g. logic level 1, on the enable/disable link 114. This means that the first recovered clock 814 is carried on the outgoing lock link 120. If the external clock disable signal 808 OFF, e.g. logic level 0, the first recovered clock 814 is no longer carried on the outgoing lock link 120. In this case the second recovered clock 810 is no longer carried on the recovered clock link 118 and no phase aligned data will appear on the outgoing data link 122. ON/OFF can either be logic level "1"/"0" or logic level "0"/"1". When the external clock disable signal 808 is ON, the clock extractor 102 is already locked with the pulses 804 which are sent to the clock extractor 102 from the pulse generator 106 through the pulse link 116. So, the phase aligner 106 is able to make the data re-aligned when the first positive second recovered clock edge is present on the recovered clock link 118. The data 806 coming on the data link 112 will be delayed by a factor ψ. Phase aligned data 812 is carried on the outgoing data link 122. The second recovered clock 810, which is used to re-sample the data 806, can be inverted with respect to the first recovered clock 814, on the outgoing clock link 120. τ is the delay time between the initial bit presence at the incoming data link 110 and the rise clock edge of the outgoing clock link 120 which is related to the same bit indicated previously.

Detailed Description of the DTRM

Following will be a detailed description of the DTRM, which is a hybrid SIL circuit which could have the following dimensions: (41,2×10,6×0.6 mm). A four layer impedance controlled PCB (printed circuit board) has been used and all components are distributed on the two external layers. An external metal shield has been used to prevent electromagnetic irradiation. It is virtually connected to the ground, by using a decoupling capacitor.

This invention has been developed for two clock recovery operation frequencies, 184.320 MHz and 155.520 MHZ. It can be used to extract the clock from NRZ scrambled data at different bit rates from 10 Mbit/s up to 500 Mbit/s. The DTRM 100 has been designed for the USI4 interfaces to extract the timing information from a serial data link properly coded. The DTRM can extract clock information for at least one data transition every 24 bits group. By using another value of variable inductor, the DTRM 100 can also be used to extract the timing information from the serial data link at 155.520 MHz properly coded in order to have at least one data transition every 24 bits group.

The data and clock I/O interfaces are differential emitter coupled logic (ECL). In case of positive power supply voltages differential pseudo emitter coupled logic (PECL) are used. The input interface can be serial or parallel. In PECL mode the output interfaces must not be shorted directly to the ground otherwise the output drivers could be damaged.

The pulse'spolarity is one of the most important parameters because it determines the clock edge polarity. In order to respect the data setup and hold time, negative pulses are used for this embodiment, but positive pulses could be used.

The pulse generator circuit 106, FIG. 2, is implemented by the ECL differential splitter device 202. One of two the differential outputs is short circuited. At every data transition event the zero crossing circuit 200 generates a pulse which is injected into the ILO 306 to lock-in phase a clock signal, the first recovered clock 814 and the second recovered clock 810. The pulse characteristic depends on the s reaction times of the ECL different splitter 202. In this case the pulse wave form on the same rise and fall times, to simplify the circuit architecture and to reduce the power consumption, but to increase the actual clock extraction performance of this application another type of wave form is recommended. This wave form should have a rise time slower than the actual choice in order to speed up the locked phase of the ILO 306 and to increase the lock bandwidth. The data link 112 is used to drive the phase aligner circuit 104.

The clock extractor 102, FIG. 3, uses the injection locked oscillator circuit 306, ILO, to extract timing information. The ILO 306 is realized only by an oscillator injected by a pulse at every data transition event. The pulses 804 are generated every data transition and synchronize the edge waveform produced by the oscillator. The pulse polarity determines the lock phase of the ILO 306. This embodiment is using the negative pulses 804 in order to synchronize the data negative edges with the clock negative ones. The data information is re-sampled in order to generate correct setup and hold time. The oscillator is a grounded base Colpitts architecture implemented by a transistor Q1, e.g. a BFR92, powered by a voltage regulator (3.6 V), not shown, to avoid frequency drift. The pulses 804 are directly injected to the adder node 318 via the emitter of the transistor Q1 by using the decoupling capacitor C1, see FIG. 3. During calibration of the oscillator the center frequency should be adjusted acting on a high performance variable inductor implemented on the clock extractor 102 by using a data pattern which simulates the worst situation for the clock recovery operation. The oscillator output 304 is buffered 300 by a ECL line receiver-driver, e.g. clock extractor buffer 300, to regulate automatically a clock duty cycle.

The phase aligner circuit 104, FIG. 4, provides the data/clock phase alignment in order to have the negative second recovered clock 810 and the data 806 edges in a correct phase relation. This is done by a ECL differential D-flip-flop device which receives the data 806 information on the data link 112 coming from the pulse generator 106 and the second recovered clock 810 on the recovered clock link 118 coming from the clock extractor 102.

The clock killer circuit 108, FIG. 5, can give an alarm when not receiving the data 806 on the data link 112. This is implemented by the peak detector 500 connected to the voltage comparator 502 which has an open collector output stage. If the loss of data link 156 is connected to the enable/disable link 114, the clock killer 108 can switch OFF the clock extractor buffer 300, see FIG. 3, when the data 806 information is missing on the data link 112. This clock killer circuit 108 can also be used as a loss of data alarm. The connection to the clock-extractor buffer 300 is external, so it can be removed if the clock extractor 102 must be left in free running mode. In this case the enable/disable link 114, see FIG. 1, must be connected to negative power voltage. The clock killer circuit 108 can also be used as the loss of signal alarm generator. The clock killer 108 can turn ON the clock extractor buffer 300 when the incoming data 802 is present. The clock extractor buffer 300 can be switched ON and OFF even if the enable/disable link 114 is not connected to the loss of data link 156 but connected to some other external unit which is not shown in this embodiment.

The oscillation conditions in the ILO 306, in FIG. 6a, to extract clock signal are described by using two formulas:

$$|\alpha\beta|\geq 1, \angle\overline{\alpha\beta}\cong 0$$

The first formula shows the relation between the selective amplifier gain 612 and the attenuator 614 of the reaction network. The second formula shows the phase relation needed to start the ILO 306 oscillation. In this situation the ILO 306 can be considered a free running oscillator and its frequency depends only on the physical parameters of the selective amplifier 612 and it should be set by acting on the variable inductor L1, FIG. 3. To perform the injection locked effect the adder node 318 is needed. It consists of an analog mixer which is used to mix the synchronized pulses the injection $\overline{Xi}$ signal 622 with a reaction $\overline{Xr}$ signal 628 of the oscillator.

These formulas are obtained from the transfer function of this architecture:

$$\overline{\alpha} = \frac{\overline{Xu}}{\overline{Xi}}; \overline{\beta} = \frac{\overline{Xr}}{\overline{Xu}} \rightarrow \overline{Xu} = \overline{\alpha}\,\overline{Xi}; \overline{Xr} = \overline{\beta}\,\overline{Xu} \quad (1)$$

$$\text{but } \overline{Xt} = \overline{Xi} - \overline{Xr} \text{ and } \overline{Ar} = \frac{\overline{Xu}}{\overline{Xt}} \rightarrow \overline{Ar} = \frac{\overline{\alpha}\,\overline{Xi}}{\overline{Xi} - \overline{Xr}}$$

$$\text{so } \overline{Ar} = \frac{\overline{\alpha}\,\overline{Xi}}{\overline{Xi} - \overline{\alpha}\,\overline{\beta}\,\overline{Xi}} = \frac{\overline{\alpha}}{1 - \overline{\alpha}\,\overline{\beta}}$$

$$\begin{cases} \angle \overline{\alpha}\overline{\beta} = 0 \\ |\alpha\beta| \geq 1 \end{cases} \quad (2)$$

were $\overline{Ar}$ is a function of the ILO 306. The condition (1) is applicable only if $|\alpha\beta|<1$. In the other situations the poles analysis must be considered in the transfer function (1). There are three possible conditions: $|\alpha\beta|<1$, $|\alpha\beta|=1$, $|\alpha\beta|>1$. The condition $|\alpha\beta|=1$ is also called the Barkhausen condition and it represents the stability limit. Above this limit ($|\alpha\beta|>1$) the ILO 306 starts to oscillate with an oscillation period that satisfies the condition in (2).

In FIG. 6b is shown the vectorial diagram 600 of the oscillation condition of the two input signals in the adder node 318. The pulse'spolarity determines the locked phase of the oscillator. In this case it is needed to re-establish the correct phase alignment between the data and the second recovered clock at the output time. In this embodiment the negative pulses 804 are used in order to synchronize the data's negative edges with the clock's negative ones. The reaction $\overline{Xr}$ signal 628 is a cycling vector with the same phase as of the output vector $\overline{Xu}$ signal 626, FIG. 6a. If another reaction vector is injected in the adder node 318 the situation in FIG. 6b will occur. The reaction $\overline{Xr}$ signal 628 is represented by a rotating vector and it has a rotation period $T_1$, which is the inverse of the frequency generated by the oscillator. The resultant $\overline{Xi}$ signal 624 depends on the amplitude and the phase parameters of the other two the reaction $\overline{Xr}$ signal 628 and the injection $\overline{Xt}$ signal 622.

Normally in the block diagram of an oscillator the injection $\overline{Xt}$ signal 622 does not appear because the oscillation can start without it. The adder node 318 also does not appear because the reaction $\overline{Xr}$ signal 628 and the resultant $\overline{Xi}$ signal 624 are the same parameter. This invention wants to lock the oscillator with the pulses 804 generated at every data transition by using the adder node 318 to make a vectorial sum of the reaction $\overline{Xr}$ signal 628 with the pulses 804, the injection $\overline{Xt}$ signal 622 injected through the pulse link 116.

If the injection $\overline{Xt}$ signal 622 is applied at the adder node 318 we obtain the situation showed in FIG. 6b. The resultant $\overline{Xi}$ signal 624 will be affected by an instantaneous phase jump and also its amplitude will change. If the injection $\overline{Xt}$ signal 622 is constituted of the pulses 804 which have a period $T_2$ about a multiple m of the natural period $T_1$ of the oscillator and if the amplitude of these pulses are comparable with the amplitude of the reaction $\overline{Xr}$ signal 628, the oscillator will be locked in phase to the $T_2$ period. The injection $\overline{Xt}$ signal 622 can be constituted by the incoming data 802 and will lock-in phase the same way as the pulses 804.

If $|\overline{Xr}|>|\overline{Xt}|$, the resultant $\overline{Xi}$ signal 624 is more affected by the reaction $\overline{Xr}$ signal 628 parameters. This also means that the injection $\overline{Xt}$ signal 622 does not produce relevant effects on the output vector $\overline{Xu}$ signal 626, so it could cause only jitter at the oscillator output if the injection $\overline{Xt}$ signal 622 frequency and the normal frequency of the oscillator are different. This means that the locking bandwidth of the ILO 306 is dependent on the magnitude $|\overline{Xt}|$ of the injection $\overline{Xt}$ signal 622. The stronger the injection $\overline{Xt}$ signal 622 the larger the locking bandwidth.

If vector $|\overline{Xt}|=|\overline{Xr}|$ both of these components have the same effect on the resultant $\overline{Xi}$ signal 624. If the injection $\overline{Xt}$ signal 622 and the reaction $\overline{Xr}$ signal 628 have the same frequency and if the vectorial sum of them generate the resultant $\overline{Xi}$ signal 624 with enough energy, the oscillation condition will be reestablished. This is true also if the normal frequency of the oscillator and the frequency of the injection $\overline{Xt}$ signal 622 are nearly but not exactly the same, because the ILO 306 is looped back, thus the reaction $\overline{Xr}$ signal 628 depends also from the injection $\overline{Xt}$ signal 622. If the injection $\overline{Xt}$ signal 622 frequency is contained inside the amplifier bandwidth the resultant $\overline{Xi}$ signal 624 will follow the injection $\overline{Xt}$ signal 622 and the oscillation period will be locked by the injection $\overline{Xt}$ signal 622 frequency.

If the injection $\overline{Xt}$ signal 622 is switched off for a time of more than one period, the oscillator will be still active because the oscillation is guaranteed by the reaction $\overline{Xr}$ signal 628. During these periods the phase difference between the reaction $\overline{Xr}$ signal 628 and missing the injection $\overline{Xt}$ signal 622 will increase, but when the injection $\overline{Xt}$ signal 622 is switched on again the resultant $\overline{Xi}$ signal 624 will be affected by a phase jump. The previous lock-in situation will be reestablished provided that the phase jump is not be so large as to generate intermodulation products distributed out of the amplifier bandwidth. The same situation can be obtained if the injection $\overline{Xt}$ signal 622 is an instantaneous vector pulse sometimes inserted in the adder node input 602, but its magnitude must be larger than the reaction $\overline{Xr}$ signal 628 ($|\overline{Xt}|>|\overline{Xr}|$), see FIG. 6b, in order to generate a relevant harmonic product contained into the amplifier bandwidth. If this happens the oscillator could generate a signal not related to any of the two vectors.

The limits of frequencies for locking pulses depend on the amplitudes of the injection $\overline{Xt}$ signal 622 and the reaction $\overline{Xr}$ signal 628, on the frequency relation between them, and on the Q factor of the LC resonator, see FIG. 3, implemented in the oscillator. The frequency relation between the reaction $\overline{Xr}$ signal 628 and the injection $\overline{Xt}$ signal 622 must be an integer number, and it could be a time variable. The data transitions are time variable too, so they can synchronize the oscillator.

Detailed Description of the Method

The method for using this kind of circuit will now be described. External incoming signals are independent of each other and can come in at any time and internal signals can be independently received at any time. This embodiment needs the clock extractor stage 714. If desired, the pulse generator stage 700, the phase aligner stage 742 and the clock killer stage 754 can be used.

The method for clock recovery starts with the pulse generator stage 700, see FIG. 7. The incoming data 802 is received 702 on the incoming data link 110 to the pulse generator 106 via the incoming data link input 130 of the pulse generator 106. Then at every data transition event the zero crossing circuit 200 generates 704 the negative pulse 804. Further, the differential splitter 202 divides 706 the incoming data 802 into the data 806 and the pulses 804. Thereafter, the pulse generator stage 700 distributes 708 the pulses 804, to the clock extractor 102 on the pulse link 116. Further stage 700 also distributes 710 the data 806 on the data link 112 to the phase aligner 104. The pulse generator 106 can also distribute 710 the data 806 on the data link 112 to the clock killer circuit 108.

In the clock extractor stage 714 the clock recovery sequence starts with receiving 716 the negative pulses 804 from the pulse generator stage 700. This clock recovery sequence recovers 718 the timing information from the pulses 804 generated by the pulse generator 106, see FIGS. 6a–b. Thereafter, the clock recovery sequence distributes 720 the second recovered clock 810 to the phase aligner stage 742. The clock extractor 102 also distributes 722 the first recovered clock 814 to the outgoing clock link 120.

The clock extractor stage 714 can be in disabled mode or in normal mode. If the loss of signal link 156 and the enable/disable link 114 are connected to each other which would result in that external clock disable signal 808 and the data loss signal being equal to each other.

The disabled mode is equal to the switching off sequence in the clock extractor stage 714. In case of an external alarm, i.e. from the clock killer stage 754, the clock extractor buffer 300 can be disabled when receiving 726 the external clock disable signal 808 OFF on the external enable/disable link 114. This will switch off clock sequence and switch OFF the clock extractor buffer 300 to disable mode. This sequence will also close 728 the clock extractor buffer 300 and turned off 730 the sending of the first recovered clock 814 to the outgoing clock link 120 and to the second recovered clock 810 to the phase aligner stage 742. Thereafter, the switching off clock sequence returns to clock extractor stage 714.

The normal mode is equal to switching on clock sequence in the clock extractor stage 714. In case of the alarm being switched off, the clock killer stage 754 can put the clock extractor buffer 300 back to normal mode. This is done when receiving 734 the external clock disable signal 808 ON, on the external enable/disable link 114. This will switch on clock sequence and open the clock extractor buffer 300 to normal mode. The second recovered clock 810 is turned on 736 by opening the clock extractor buffer 300. This sequence can also turn on 738 sending the first recovered clock 814 to the outgoing clock link 120 and the second recovered clock 810 to the phase aligner stage 742. Thereafter, the switching on clock sequence returns to the clock extractor stage 714.

The phase aligner stage 742 receives 744 the data 806 from the pulse generator stage 700 and receives 746 the second recovered clock 810 from the clock extractor stage 714. Then, these two signals are aligned 748. When alignment is done, phase aligned data 812 is sent out 750 on the outgoing data link 122. Followed by the phase aligner stage 752 which is equal to the block 742.

The clock killer stage 754 is not necessary for the invention but is useful as an alarm feature when the incoming data 802 are not present. This stage 754 receives 756 the data 806 from the pulse generator stage 700. Then, a question is whether there is any "data?" 758. If the answer is YES in the 758 the external clock disable signal ON is sent out 760. If the answer is NO in the block 758 then an alarm is sent 762. Further, the external clock disable signal OFF is sent out 764. From the blocks 760 and 764 this stage ends with the clock killer stage 760 which is equal to the block 754.

Alternative Embodiments

Figure 9:
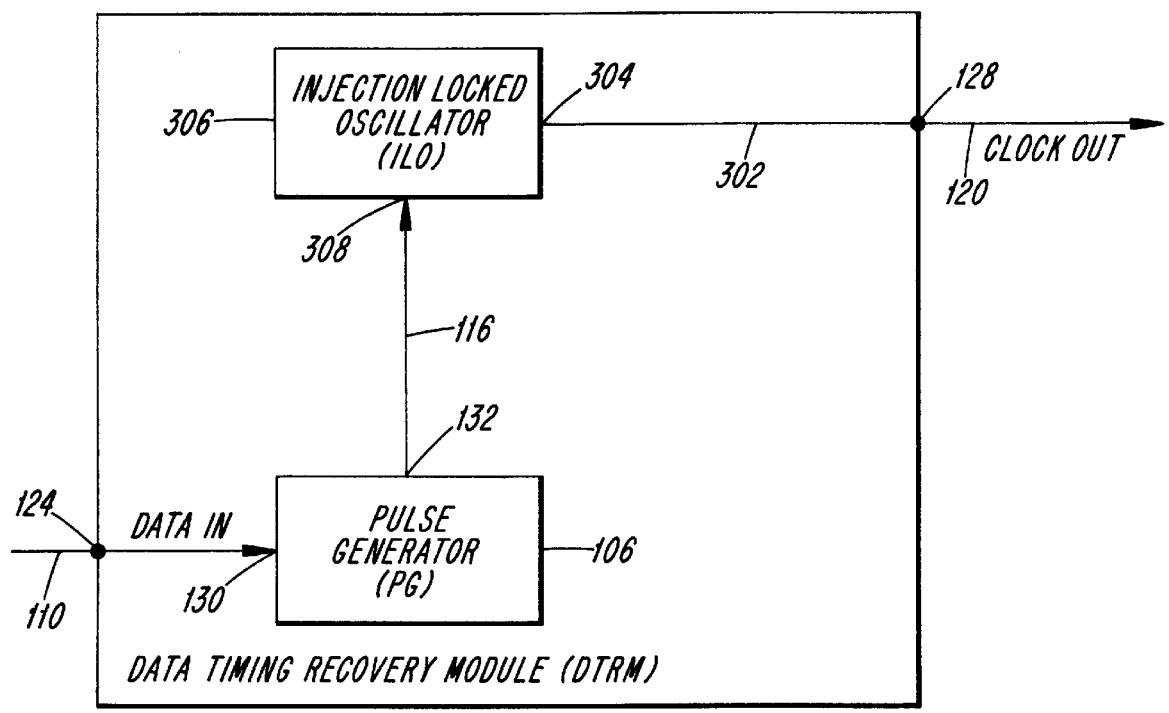
FIG. 9 shows an alternative embodiment of the DTRM.

In FIG. 9 is shown an alternative time recovery system 900 which includes the pulse generator circuit 106 and the injection locked oscillator 306. The incoming data link 110 is connected to the pulse generator circuit 106. This circuit only has to be connected to the pulse link 116. The pulse link 116 is connected to the injection locked oscillator 306 at the oscillator input 308. The recovered clock link 302 is connected between the injection locked oscillator 306 at the oscillator output 304 and the outgoing clock link output 128. The recovered clock link 302 is equal to the outgoing clock link 120, see FIG. 1.

Another alternative time recovery system can be that, instead of the injection locked oscillator 306, the clock extractor circuit 102 is installed. The pulse link 116 and the recovered clock link 118 is connected in the same way as in FIG. 1.

An alternative time recovery system does not need to have the clock extractor buffer 300 in the clock extractor circuit. Therefore, the alternative system does not need to have the is enable/disable link 114, the outgoing data link 120 and internal external connections belonging to these links.

Alternative embodiment will lie in the same range from just the pulse generator circuit 106 and the injection locked oscillator 306 to all circuits, parts, and components which are described in FIG. 1.

Alternative methods follow the physical condition of the time recovery system. If only the injection locked oscillator 306 and the pulse generator 106 are used. The method only includes parts of the pulse generator stage 700 and the clock extractor stage 714. These stages will receive the incoming data 802 to the pulse generator 106. Then sending the generated pulses 804 to the ILO 306. Followed by recovering the first recovered clock and thereafter sending the first recovered clock 814 onto the outgoing clock link 120.

In another method where the clock killer circuit 108 is not present then the clock killer stage 754 is not present. If just the injection locked oscillator 306 is present then the clock extractor stage 714 does not have the steps 726 until the step 740.

All methods will follow the physical conditions which are described above. If there is no clock killer circuit there can not be any clock killer stage 754 and so on.

The invention described above may be embodied in yet other specific forms without departing from the spirit or essential characteristics thereof. Thus, the present embodiments are to be considered in all respects as illustrative and not restrictive, the scope of the invention being indicated by the appended claims rather than by the foregoing descriptions, and all changes which come within the meaning and range of equivalency of the claims are therefore intended to be embraced therein.

What is claimed is:

1. A data timing recovery system for clock recovery comprising:
   a pulse generator circuit; and
   an injection locked oscillator, the system being connected to an incoming data link and an outgoing clock link wherein the pulse generator circuit further comprises:
   a zero crossing circuit; and
   a differential splitter, being connected with the zero crossing circuit, the differential splitter being connected to the incoming data link, and the zero crossing circuit being connected with a pulse link to the injection locked oscillator where the pulse generator circuit generates a pulse at every data transition event to form a flow of pulses to the injection locked oscillator that utilizes the pulses to phase lock a frequency and is also connected to the outgoing link that is sending out a first recovered clock.

2. The data timing recovery system of claim 1 wherein the differential splitter is connected to a second data link.

3. The data timing recovery system of claim 2 wherein a phase aligner circuit is connected to a clock extractor via a recovered clock link and to the pulse generator circuit via the second data link and to an outgoing data link.

4. The data timing recovery system of claim 2 further comprising a clock killer circuit connected to the pulse generator circuit via the second data link and to a loss of signal link.

5. The data timing recovery system of claim 1 further comprising:

a clock extractor including the injection locked oscillator; and a clock extractor buffer being connected to the oscillator by a recovered clock link wherein the clock extractor buffer is connected to the outgoing clock link.

6. The data timing recovery system of claim 5 wherein the clock extractor buffer is connected to an enable/disable link.

7. A method for clock recovery in a data timing recovery system having a pulse generator stage and a clock extractor stage comprising the steps of:

the pulse generator stage receiving incoming data, generating pulses at every data transition event, dividing the incoming data to pulses and to data, sending the data to a phase aligner stage and the pulses to the clock extractor stage; and the clock extractor stage receiving the pulses from the pulse generator stage, recovering a second recovered clock signal with the help of the pulses, and sending out a first recovered clock to an outgoing clock link.

8. The method of claim 7 further comprising the steps of the pulse generator stage sending the data to a clock killer stage.

9. The method of claim 8 further comprising the steps of:

the clock killer stage, when receiving the data from the pulse generator stage, sending out a data loss signal ON on a loss of signal link.

10. The method of claim 8 further comprising the steps of:

the clock killer stage, when not receiving the data from the pulse generator stage, setting an alarm, sending out a data loss signal OFF on a loss of signal link.

11. The method of claim 7 further comprising the steps of the clock extractor stage distributing the second recovered clock to the phase aligner stage.

12. The method of claim 11 further comprising the steps of:

the clock extractor stage turning off the sending of the second recovered clock to the phase aligner stage.

13. The method of claim 11 further comprising the steps of:

the clock extractor stage turning on the sending of the second recovered clock to the phase aligner stage.

14. The method of claim 7 further comprises the steps of:

the phase aligner stage receiving the data from the pulse generator stage, receiving the second recovered clock from the clock extractor stage, aligning the data and the second recovered clock resulting in phase aligned data; and sending out the phase aligned data on an outgoing data link.

15. The method of claim 7 comprising the further steps of:

the clock extractor stage, being a switching off sequence, receiving an external clock disable signal OFF on a external enable/disable link;

the clock extractor stage switching a clock extractor buffer to disable mode, closing the clock extractor buffer, turning OFF the clock extractor buffer whereby the sending of first recovered clock being turned off from the outgoing clock link.

16. The method of claim 7 further comprising the steps of:

the clock extractor stage, being a switching on sequence, receiving an external clock disable signal ON on a external enable/disable link, switching the clock extractor buffer to normal mode, opening the clock extractor buffer, turning ON the clock extractor buffer thereby initiating sending of the first recovered clock being turned on from the outgoing clock link.

* * * * *